(12) United States Patent
Li

(10) Patent No.: US 7,564,394 B1
(45) Date of Patent: Jul. 21, 2009

(54) BUFFER FOR A/D CONVERSION

(75) Inventor: Kan Li, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/890,732

(22) Filed: Aug. 7, 2007

Related U.S. Application Data (60) Provisional application No. 60/822,150, filed on Aug. 11, 2006.

(51) Int. Cl.
*H03M 1/12* (2006.01)

(52) U.S. Cl. .................................. 341/155; 341/122

(58) Field of Classification Search ................. 341/122, 341/155, 143
See application file for complete search history.

(56) References Cited

U.S. PATENT DOCUMENTS 6,100,832 A * 8/2000 Uesugi ........................ 341/139
6,697,006 B1 * 2/2004 McCartney et al. ......... 341/155
2004/0183705 A1 * 9/2004 Colonna et al. ............. 341/122

\* cited by examiner

*Primary Examiner*—Brian Young (57) ABSTRACT

A buffer for the input to an A/D converter operates in two stages. During the first stage, the input is not provided directly to the A/D converter; rather, a buffered output which corresponds to the input is provided to the A/D converter so as to pre-charge the sampling capacitor of the A/D converter to a value that is substantially close to the input. In the second stage, the input is provided directly to the A/D converter, which charges its sampling capacitor to the value of the input. Because the sampling capacitor is pre-charged to a value that is substantially close to the input, and because the sampling capacitor is charged to this value through a buffer, reflections back into the input which otherwise might have been caused by a difference between the value stored on the sampling capacitor and the input are largely avoided.

14 Claims, 12 Drawing Sheets

BUFFER FOR A/D CONVERSION

CROSS-REFERENCE TO RELATED APPLICATION

This application claims the benefit of U.S. Provisional Patent Application No. 60/822,150, filed Aug. 11, 2006, the contents of which are hereby incorporated by reference as if fully stated herein.

FIELD OF THE INVENTION

The present invention pertains to analog-to-digital conversion of an input signal, and particularly pertains to a buffer for the input to an analog-to-digital converter.

BACKGROUND OF THE INVENTION

Figure 1A:
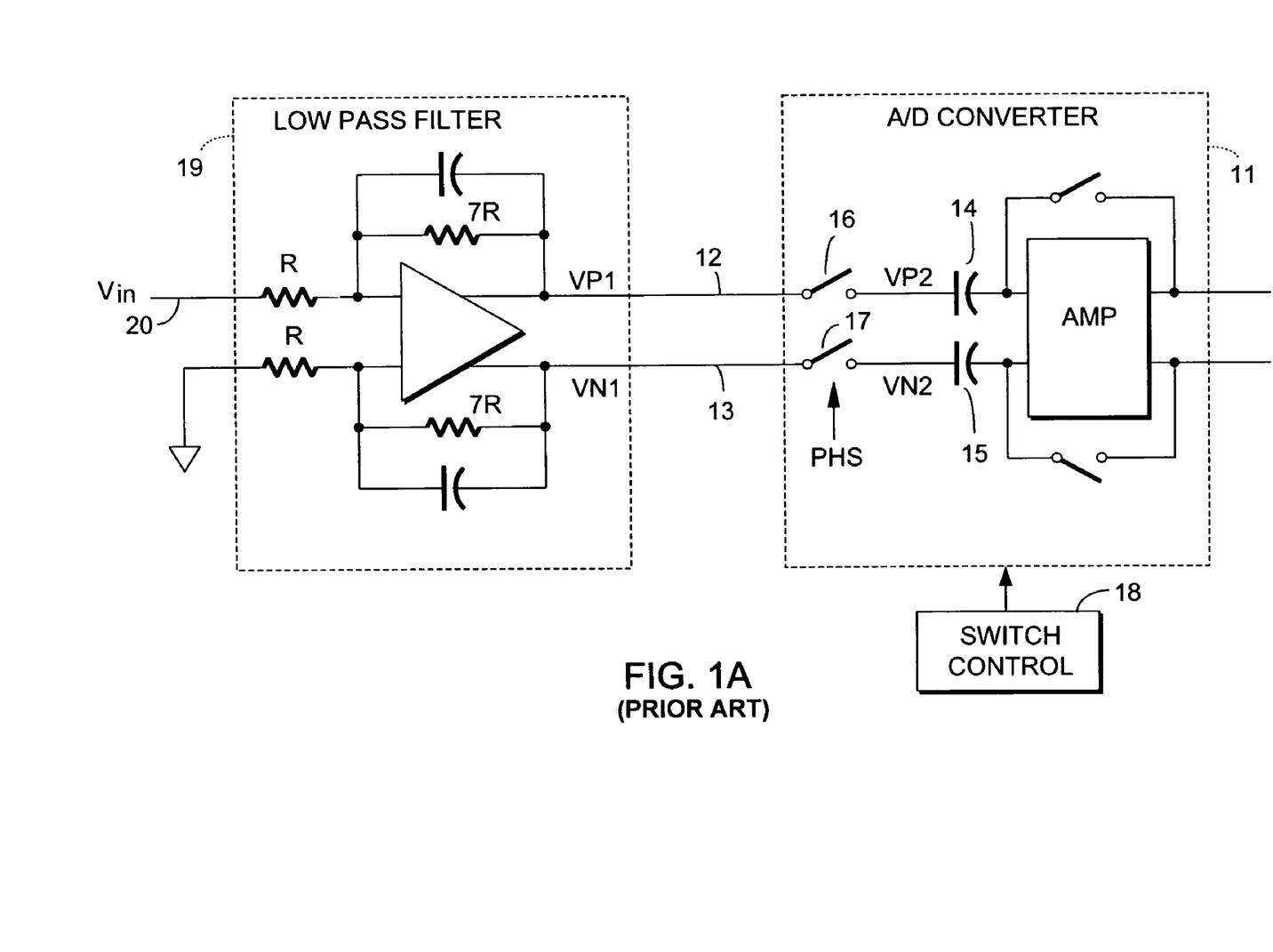
FIGS. 1A and 1B are block diagrams showing conventional A/D converters.

A conventional arrangement involving an analog-to-digital converter (hereinafter an "A/D converter") is shown in FIG. 1, which shows a A/D converter 11 that converts an analog input signal into a digital value representative of the level of the input signal. In the arrangement shown in FIG. 1, the input signal is a differential signal, including a positive level signal 12 and a negative level signal 13. A/D converter 11 includes a corresponding pair of sampling capacitors 14 and 15 which are respectively connected for sampling of the input signal by controllable switches 16 and 17. The controllable switches are controlled by a signal PHS from switch controller 18.

In the arrangement shown in FIG. 1, input signals 12 and 13 are provided from the filtered output of low pass filter 19. Low pass filter 19 removes high frequency content such as content above the Nyquist sampling frequency of A/D converter 11, and also provides for gain control of sampled signal 20 which is designated here as "Vin".

Figure 1B:
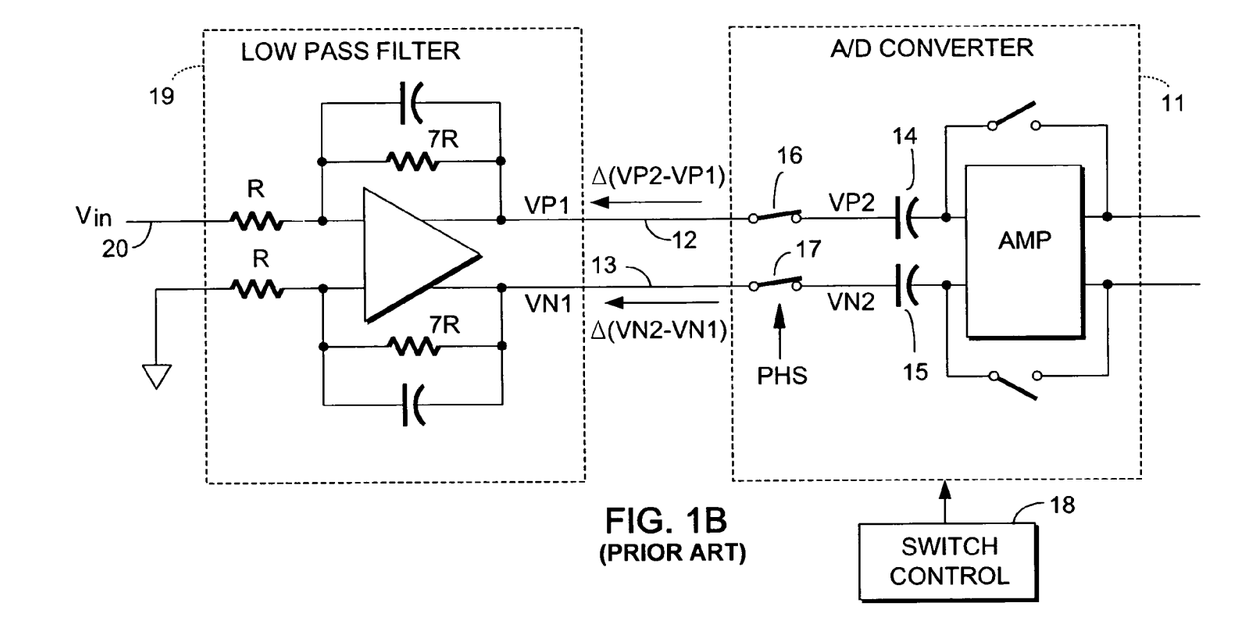
Figure 2:
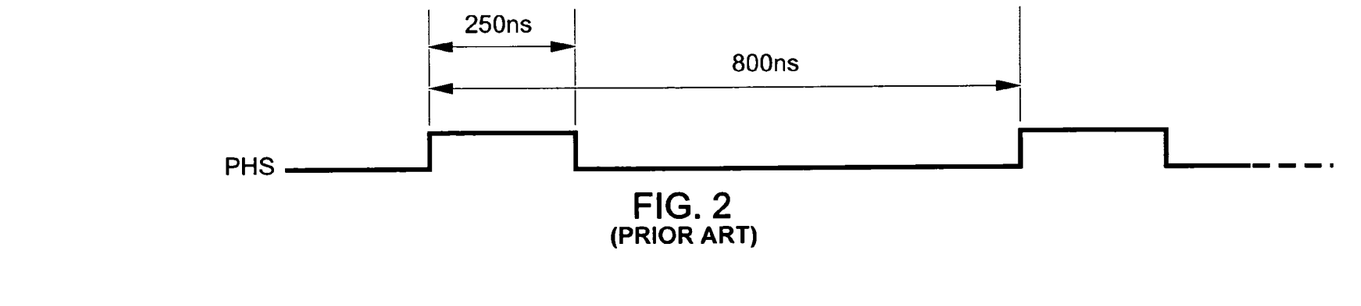
FIG. 2 is a timing diagram for conventional A/D converters.

A timing diagram for control signal PHS, as output by switch controller 18, is shown in FIG. 2. As seen in FIG. 2, the conversion frequency of A/D converter 11 is 1/800 ns=1.25 MHz. Each cycle commences with a sampling cycle, which in this case is a 250 ns time period, in which the PHS signal is raised so as to close switches 16 and 17. The arrangement of switches while the PHS signal is high is shown in FIG. 1B. This permits sampling capacitors 14 and 15 to charge to a level corresponding to the input signal. After sampling capacitors 14 and 15 have charged to the level of the input signal, switch controller 18 lowers the PHS signal so as to open switches 16 and 17. Sampling capacitors 14 and 15 retain their sampled charges, and in the ensuing conversion period before a next sampling cycle begins, A/D converter 11 converts the sampled values into corresponding digital signals.

One drawback of the above conventional arrangement concerns reflection of a previously-sampled value back into the input of A/D converter 11. Consider a situation in which sampling capacitors 14 and 15 have been charged to levels VP2 and VN2 from a previous sampling cycle. After the previous sampling cycle ends, it is natural to expect that the input signals would continue to change, and this is shown in FIG. 1B which shows that the input signals have changed to a level of VP1 and VN1 at the beginning of the current sampling cycle. Thus, when switches 16 and 17 are closed so as to obtain a sample of the current input signal, there is a reflection of the voltage differential back into the input signal, which disturbs the value of the input signal away from its true value. Given the short sampling time (in this example, 250 ns), it is possible that the input signal might not settle to its true value before the sampling period is over. As a consequence, the values stored on sampling capacitors 14 and 15 will contain an error and will not accurately correspond to true values of the input signals.

SUMMARY OF THE INVENTION

The present invention addresses drawbacks found in conventional A/D converters, by providing a buffer on the input to an A/D converter.

The buffer is switchably controlled so as to operate in two stages. In a first stage, the buffer pre-charges the sampling capacitor of an A/D converter so that it is charged to a value that is substantially close to the input signal. The buffer absorbs any possible reflection from the current value on the sampling capacitor, and thereby prevents reflection that otherwise might have occurred back into the input signal. After the first stage, the buffer is switchably controlled in a second stage in which the actual input signal is switched into the sampling capacitor. During this stage, because the sampling capacitor is already charged to a value that is substantially close to the actual input, any reflection that might still occur is virtually negligible.

Because there is a first stage during which the sampling capacitor is charged by a buffer to a value that is substantially close to the input, the difference between the input and the value on the sampling capacitor is relatively small. Accordingly, during the second stage when the sampling capacitor is connected for sampling of the input, there is relatively little reflection of this difference back into the input.

Thus, in one aspect, the invention is a buffer for an input to an A/D converter which includes a sampling capacitor. The buffer includes first and second circuit paths, in which the first circuit path connects the input to the A/D converter through a first switch. The second circuit path includes a buffer which provides a buffered output corresponding to the input, and further includes a second switch which connects the buffered output to the A/D converter. A switch controller, such as a circuit which generates timing signals, provides switching control over the first and second switches. During a sampling operation of the sampling capacitor in the A/D converter, the switch controller operates in a first stage where the first switch is open and the second switch is closed, followed by a second stage where the first switch is closed. As a consequence, during the first stage the input is not connected to the sampling capacitor of the A/D converter; rather, the buffered output is provided to the sampling capacitor, which pre-charges the sampling capacitor to a value substantially close to the input. Thereafter, in the second stage, the input is connected to the sampling capacitor of the A/D converter. During the second stage, the second switch (corresponding to the buffered output) may be opened.

In further aspects of the invention, a third switch may be provided, which discharges the sampling capacitor during a period of time prior to the first and second stages. Discharge of the sampling capacitor is preferable when the input is highly variable, such that there is little correlation between the input value at one sampling period relative to that in a subsequent sampling period. In such a situation, discharge of the sampling capacitor often yields more stable and predictable results. On the other hand, when there is a high degree of correlation from one sampling period to the next, discharge of the sampling capacitor can be safely omitted. In this regard, the invention contemplates use of a low pass filter for proving the input to the A/D converter based on a sampled signal, wherein the low pass filter is arranged to filter frequency content above the Nyquist frequency of the A/D conversion process.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE PREFERRED EMBODIMENT

Figure 3A:
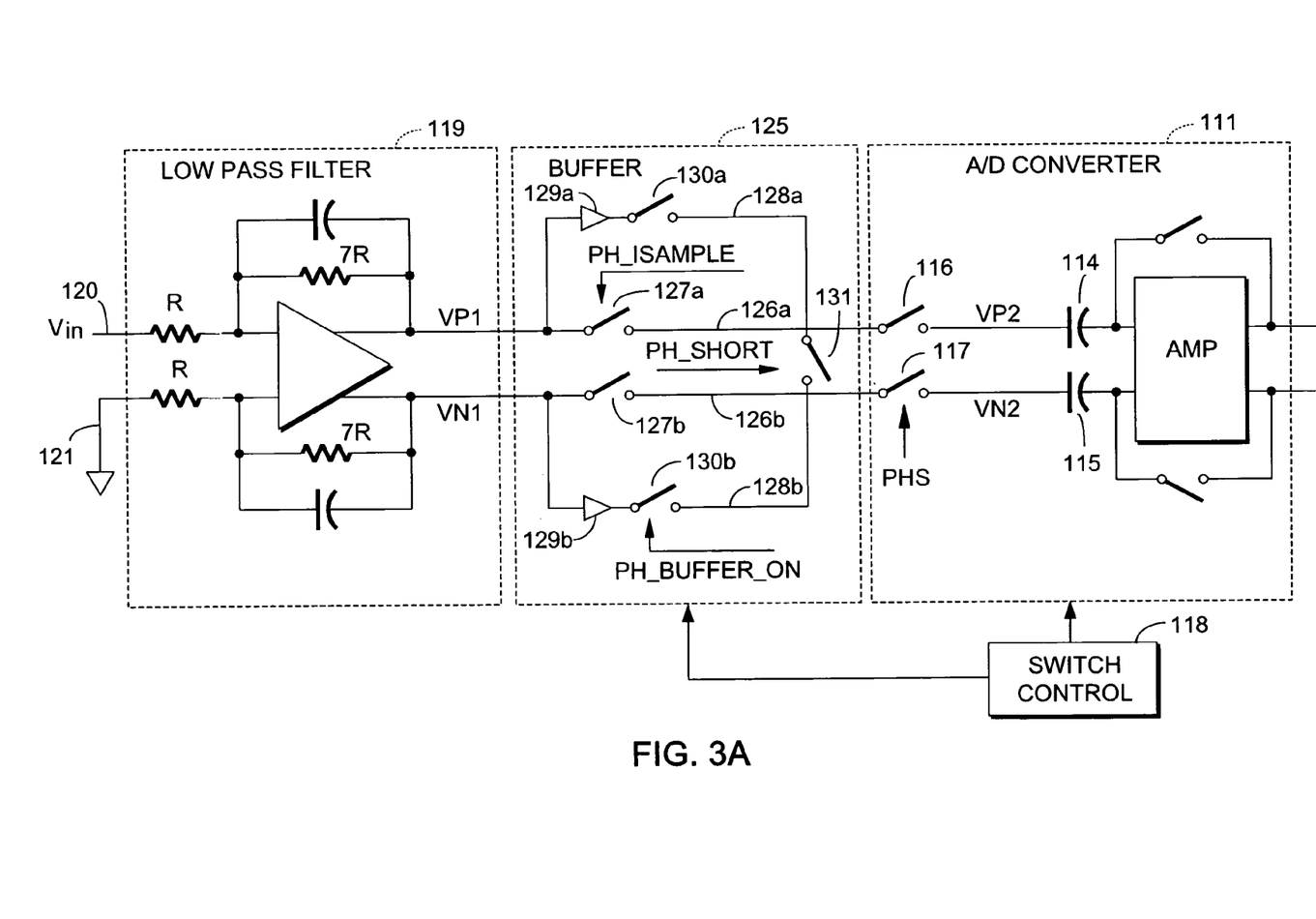
FIGS. 3A through 3D are block diagrams showing different stages of operation of an embodiment of the present invention.

FIGS. 3A through 3D show different stages of operation of an embodiment according to the invention. As shown in FIG. 3A, A/D converter 111 includes a pair of sampling capacitors 114 and 115 for respective sampling of positive and negative voltages of a differentially-supplied input. Sampling capacitors 114 and 115 are switchably controlled by corresponding switches 116 and 117, which open and close in response to switch signal PHS supplied from switch controller 118.

A low pass filter 119 applies low pass filtering and gain amplification of a sampled signal 120, here labeled "Vin". The signal is differentially sampled, against ground signal 121.

Buffer 125 is provided between A/D converter 111 and low pass filter 119, for buffering the input to A/D converter 111. Because differential inputs are provided to A/D converter 111, buffer 125 includes a pair of identical assemblies, one for each of the differential inputs. For the positive input, buffer 125 includes a first circuit path 126a which connects the positive input to A/D converter 111 through a first controllable switch 127a. First switch 127a is a controllable switch and is controlled by signal PH_ISAMPLE, generated by switch controller 118. Also for the positive input, buffer 125 includes a second circuit path 128a which includes a buffer 129a. Buffer 129a generates a buffered output corresponding to the input. The second circuit path 128a further includes a second switch 130a which connects the buffered output to A/D converter 111. Second switch 130a is a controllable switch and is controlled by signal PH_BUFFER_ON, generated by switch controller 118.

For the negative input, buffer 125 includes complementary first and second circuit paths 126b and 128b, first and second switches 127b and 130b, and buffer 129b. First switch 127b is controlled by the same PH_ISAMPLE that also controls first switch 127a. Likewise, second switch 130b is controlled by the same PH_BUFFER_ON signal that controls second switch 130a.

A third switch 131 is a controllable switch and is provided to discharge sampling capacitors 114 and 115, during a sampling operation. The third switch 131 is controlled by signal PH_SHORT, generated by switch controller 118.

The operation of this embodiment of the invention will now be described in reference to the timing signals shown in FIG. 4.

The state of all switches before sampling is shown in FIG. 3A. As seen there, because of the sampling from a prior sampling cycle, sampling capacitors 114 and 115 have respectively retained charges of VP2 and VN2. Meanwhile, because of the passage of time, the inputs have changed so that they are now VP1 and VN1, respectively.

Figure 3B:
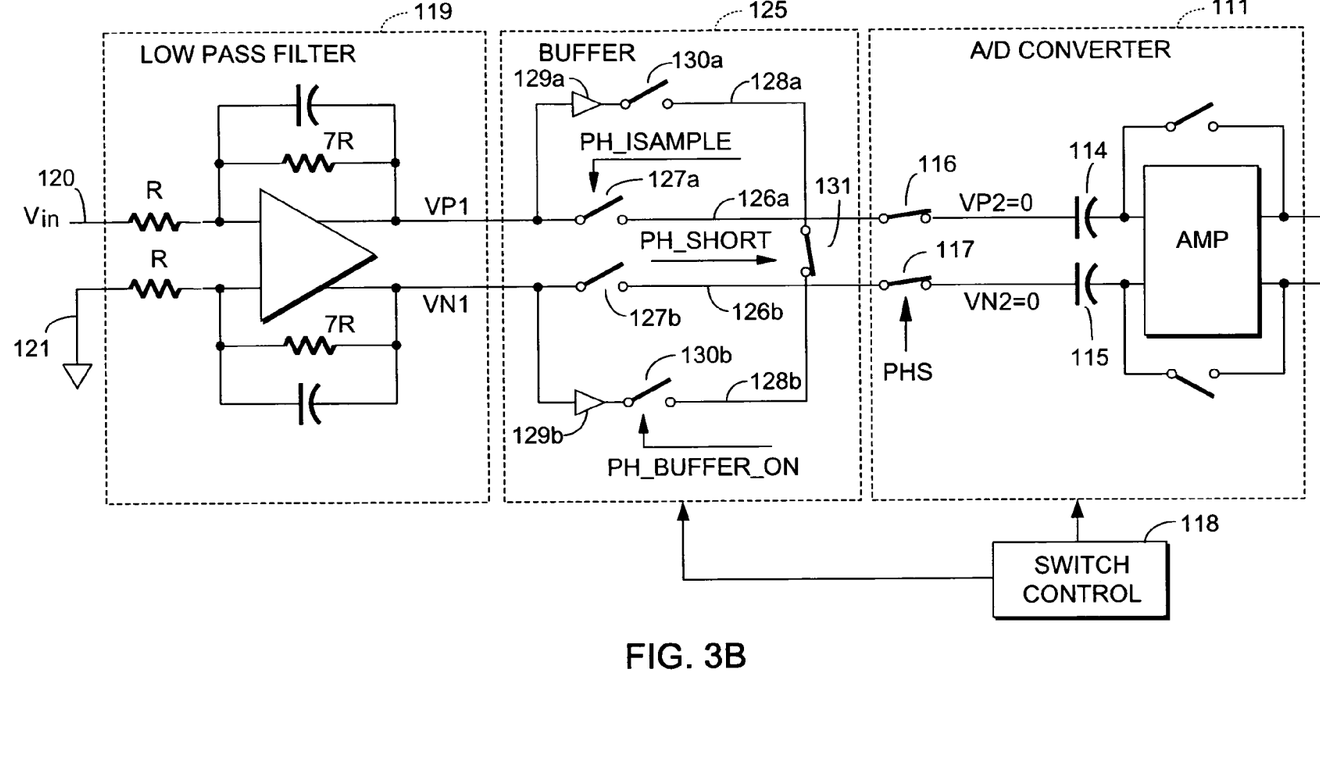
Figure 4:
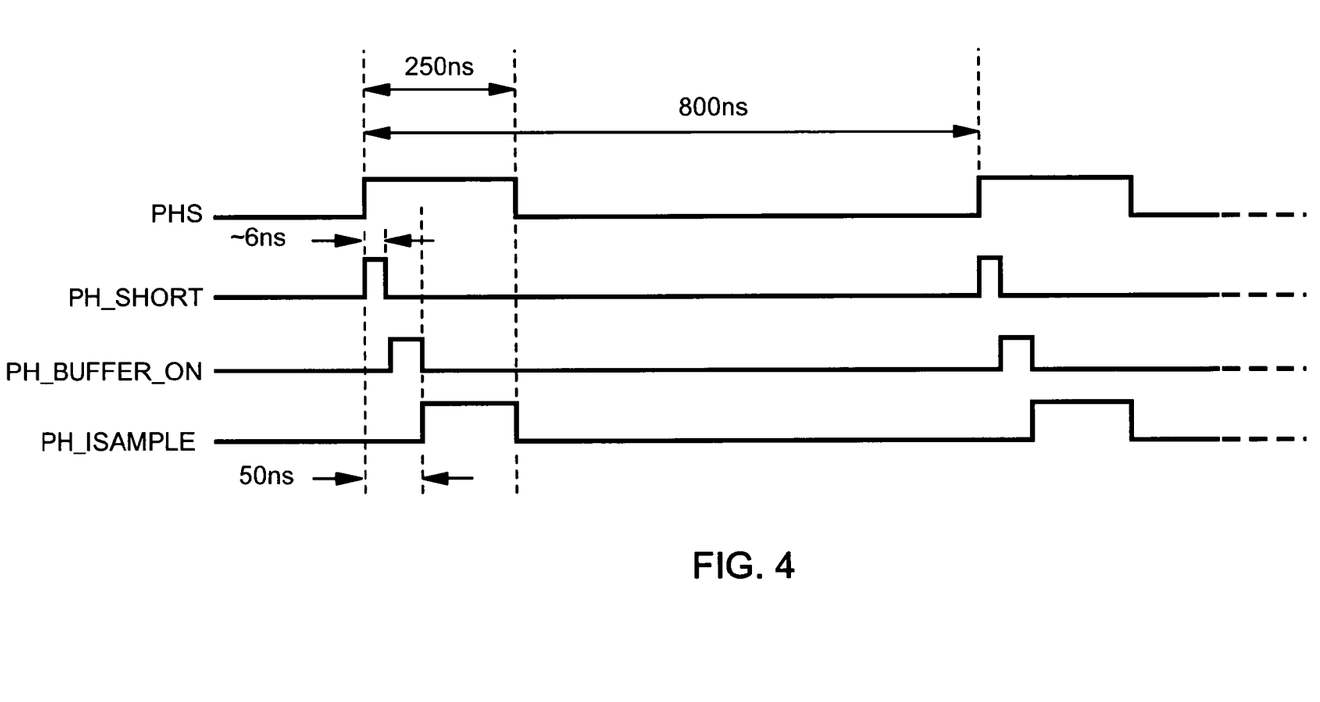
FIG. 4 is a timing diagram for use with the embodiment of FIGS. 3A through 3D.

At the commencement of a sampling cycle, and as shown in the timing diagram of FIG. 4, the PHS and PH_SHORT signals are raised. This corresponds to a change in the state of the switches, as shown in FIG. 3B. As seen there, switches 116 and 117 are closed, corresponding to the value of the PHS signal, and third switch 131 is also closed, corresponding to the value of the PH_SHORT signal. Because of this arrangement of switches, voltages stored on sampling capacitors 114 and 115 are discharged, such that the values of VP2 and VN2 are now both equal to (or close to) zero.

Switch 131 is held in the closed position for only a short period of time, relative to the overall sampling period of the sampling cycle. As shown in FIG. 4, switch 131 is held in the closed position for only approximately 6 ns out of a total sampling period of 250 ns. Thereafter, the signal on PH_SHORT is allowed to fall, and the signal on PH_BUFFER_ON is raised. This corresponds to a change in state of switches, which is shown in FIG. 3C.

Figure 3C:
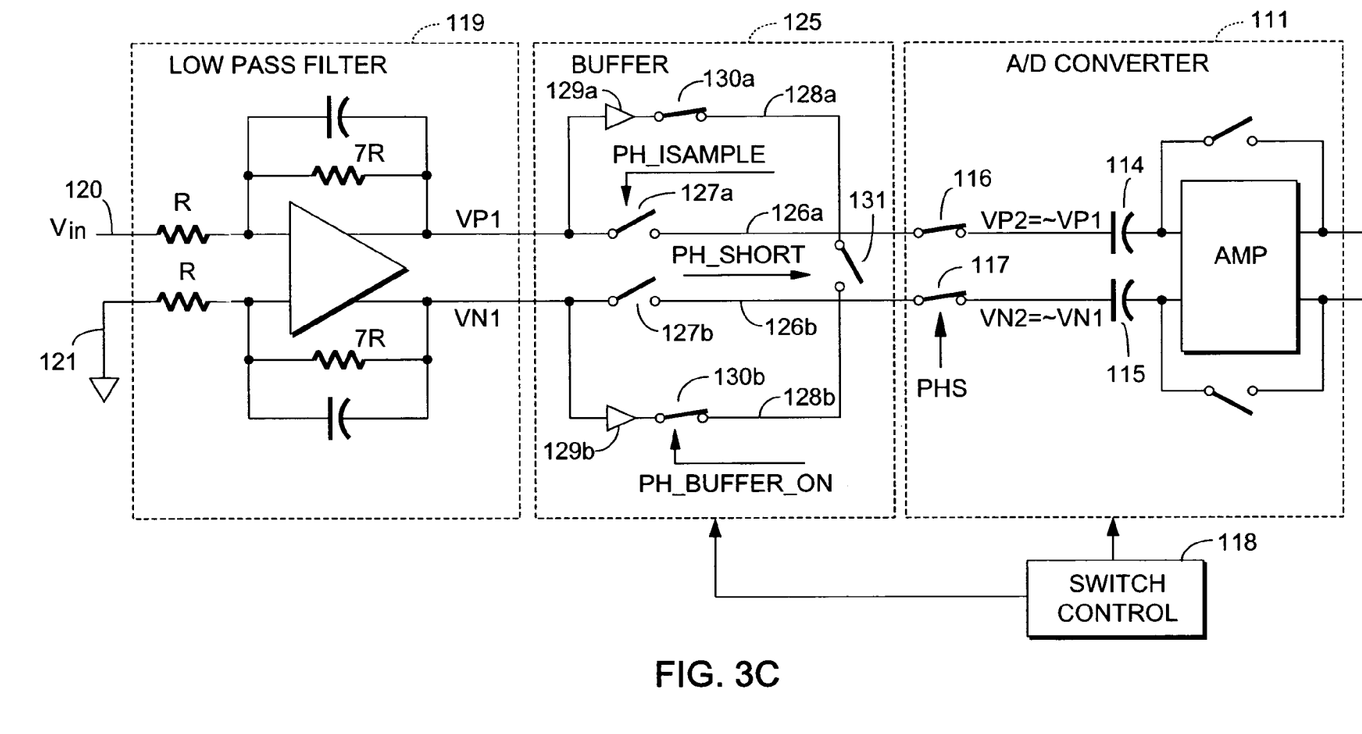

As seen in FIG. 3C, because the PH_SHORT signal is at a low level, third switch 131 is opened. On the other hand, because the PH_BUFFER_ON signal is high, second switches 130a and 130b are closed. Because of this arrangement of switches, and because the PHS signal is still high, A/D converter 111 is provided with a buffered output from buffers 130a and 130b. The buffered outputs are generated in correspondence to the inputs, which as previously noted are at levels of VP1 and VN1. As a consequence of this arrangement of switches during this first stage, sampling capacitors 114 and 115 are charged to values that are substantially close to the actual values of the inputs. This is designated in FIG. 3C, where VP2≈VP1, and VN2≈VN1.

This first stage of operation is maintained for a small but significant fraction of the sampling period. As shown in the timing diagram of FIG. 4, this first stage of operation is maintained until approximately 50 ns into the 250 ns sampling period (approximately 20%). This small but significant fraction of the sampling period is chosen for a length of time to allow sampling capacitors 114 and 115 to charge to a value substantially close to the actual inputs. Also during this time, the presence of buffers 129a and 129b act to prevent any disturbances caused by charging of the sampling capacitors from being reflected back to the input.

Thereafter, and as shown in FIG. 4, the buffer enters a second stage of operation in which the PH_BUFFER_ON signal is lowered and the PH_ISAMPLE signal is raised. The arrangement of switches during this stage of operation is shown in FIG. 3D.

Figure 3D:
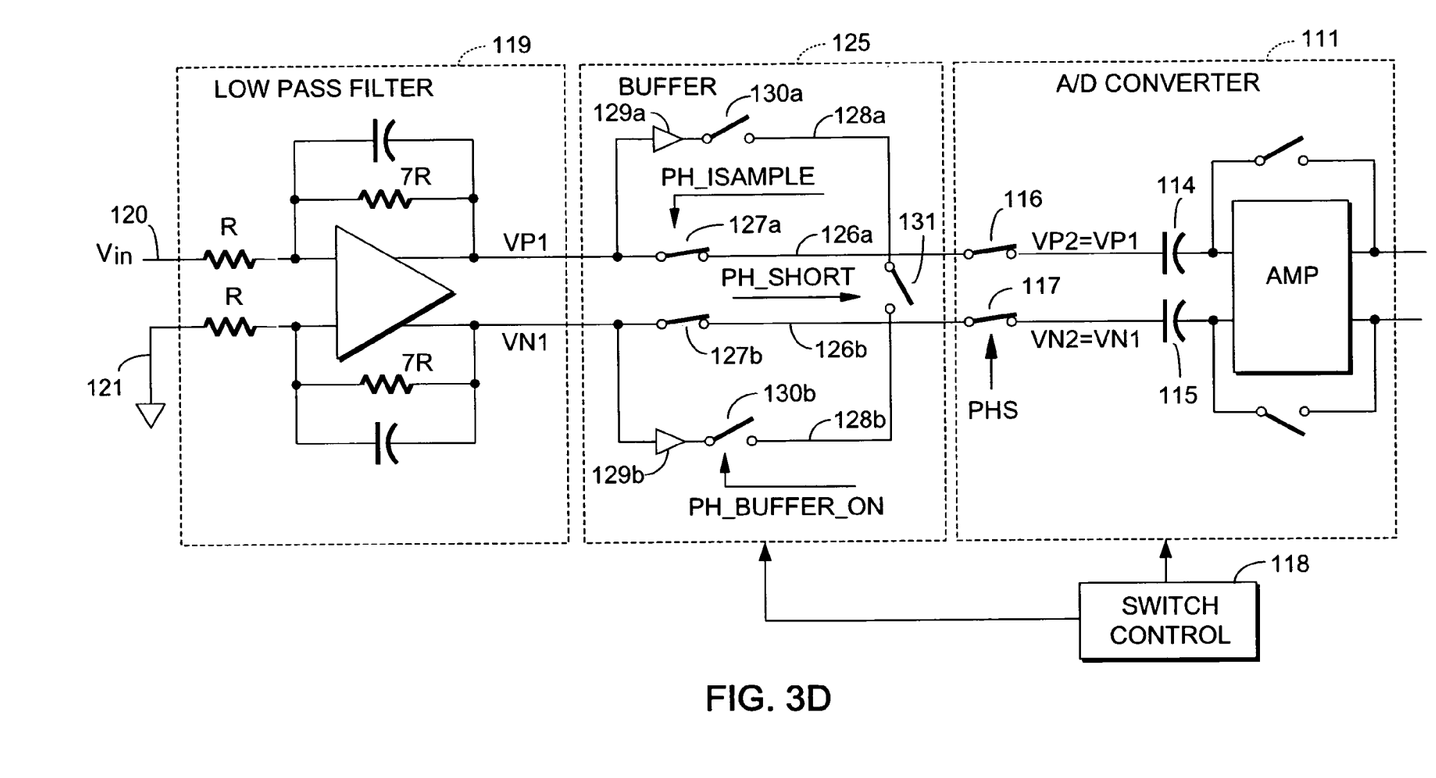

As seen in FIG. 3D, since first switches 127a and 127b are closed, the input from low pass filter 119 is provided directly to A/D converter 111. The sampling capacitors 114 and 115 charge to the levels of the inputs, which is designated in FIG. 3D as VP2=VP1, and VN2=VN1. It is noted that although second switches 130a and 130b are shown as open, and thereby disconnect the buffered output from connection to A/D converter 111, this is not always strictly necessary.

The second stage is maintained for a significant portion of the sampling period, in this case, around 80% (or 200 ns). This length of time corresponds favorably with the overall sampling period, and permits good settling of the charge on sampling capacitors 114 and 115 to the actual values of the input. Thereafter, all switches are opened, and the values stored on sampling capacitors 114 and 115 are converted by A/D converter 111 into corresponding digital values.

Figure 5:
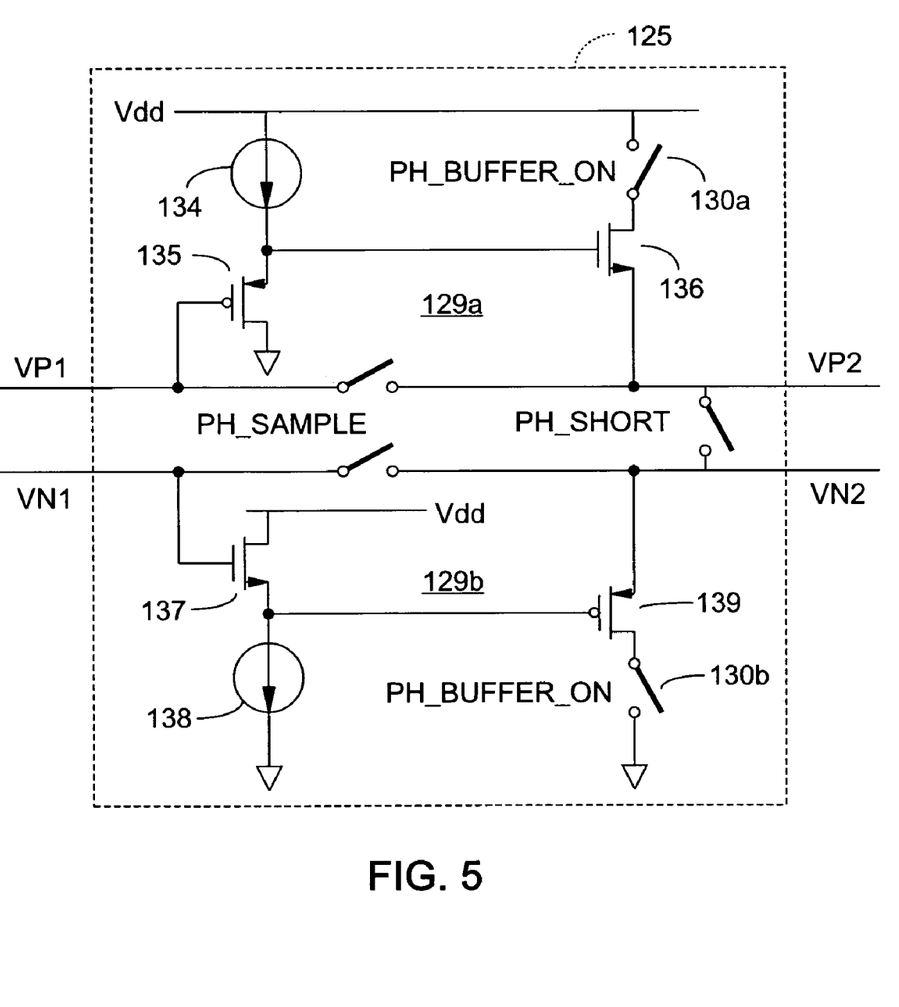
FIG. 5 is a block diagram of a buffer suitable for use in the embodiment of FIGS. 3A through 3D.

Representative circuitry for buffer 125 is shown in FIG. 5. This circuitry of FIG. 5 is preferably fabricated in CMOS technology, and preferably is fabricated on the same chip as other circuitry for which the invention is providing buffered A/D conversion of a sampled signal.

In more detail, FIG. 5 shows that buffer 129a is constructed from current source 134 and from PMOS transistor 135, arranged between Vdd and ground. In addition, NMOS transistor 136 is provided for switchable operation under control of second switch 130a.

Likewise, buffer 129b (see FIG. 3A) is constructed from NMOS transistor 137 and current source 138, connected between Vdd and ground. In addition, PMOS transistor 139 is connected for switchable control under switch 130b.

Figure 6A:
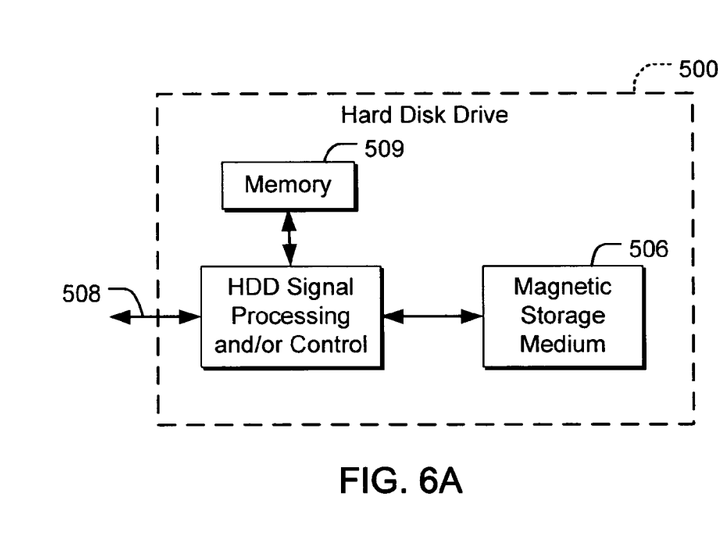
FIG. 6A is a block diagram showing an embodiment of the invention in a hard disk drive.

Referring now to FIGS. 6A-6G, various exemplary implementations of the present invention are shown. Referring to FIG. 6A, the present invention may be embodied as a voltage reference in a hard disk drive 500. The present invention may implement either or both signal processing and/or control circuits, which are generally identified in FIG. 6A at 502. In some implementations, signal processing and/or control circuit 502 and/or other circuits (not shown) in HDD 500 may process data, perform coding and/or encryption, perform calculations, and/or format data that is output to and/or received from a magnetic storage medium 506.

HDD 500 may communicate with a host device (not shown) such as a computer, mobile computing devices such as personal digital assistants, cellular phones, media or MP3 players and the like, and/or other devices via one or more wired or wireless communication links 508. HDD 500 may be connected to memory 509, such as random access memory (RAM), a low latency nonvolatile memory such as flash memory, read only memory (ROM) and/or other suitable electronic data storage.

Figure 6B:
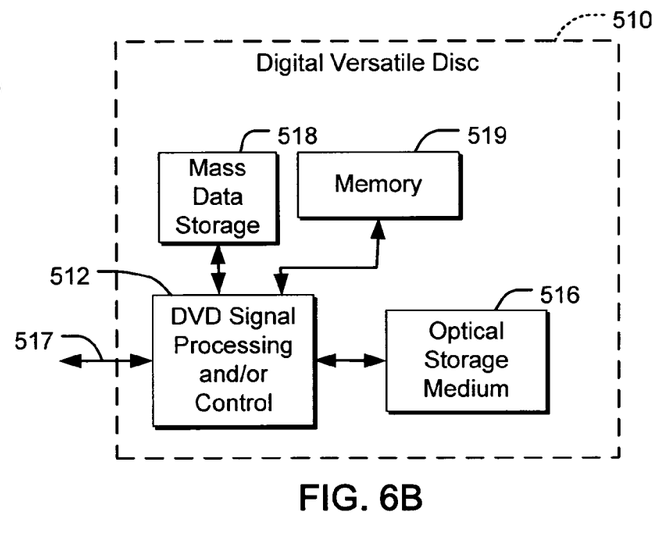
FIG. 6B is a block diagram of the invention in a DVD drive.

Referring now to FIG. 6B, the present invention may be embodied as a voltage reference in a digital versatile disc (DVD) drive 510. The present invention may implement either or both signal processing and/or control circuits, which are generally identified in FIG. 6B at 512, and/or mass data storage 518 of DVD drive 510. Signal processing and/or control circuit 512 and/or other circuits (not shown) in DVD 510 may process data, perform coding and/or encryption, perform calculations, and/or format data that is read from and/or data written to an optical storage medium 516. In some implementations, signal processing and/or control circuit 512 and/or other circuits (not shown) in DVD 510 can also perform other functions such as encoding and/or decoding and/or any other signal processing functions associated with a DVD drive.

DVD drive 510 may communicate with an output device (not shown) such as a computer, television or other device via one or more wired or wireless communication links 517. DVD 510 may communicate with mass data storage 518 that stores data in a nonvolatile manner. Mass data storage 518 may include a hard disk drive (HDD) such as that shown in FIG. 6A. The HDD may be a mini HDD that includes one or more platters having a diameter that is smaller than approximately 1.8".DVD 510 may be connected to memory 519, such as RAM, ROM, low latency nonvolatile memory such as flash memory, and/or other suitable electronic data storage.

Figure 6C:
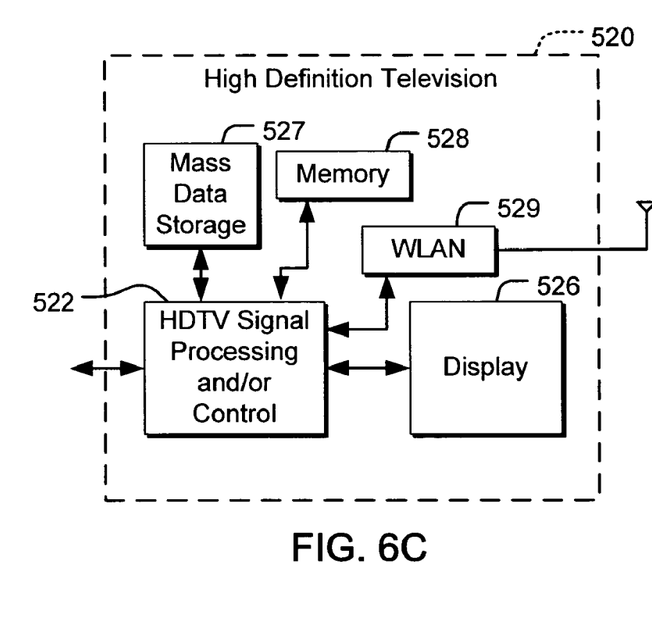
FIG. 6C is a block diagram of the invention in a high definition television (HDTV).

Referring now to FIG. 6C, the present invention may be embodied as a voltage reference in a high definition television (HDTV) 520. The present invention may implement either or both signal processing and/or control circuits, which are generally identified in FIG. 6C at 522, a WLAN interface and/or mass data storage of the HDTV 520. HDTV 520 receives HDTV input signals in either a wired or wireless format and generates HDTV output signals for a display 526. In some implementations, signal processing circuit and/or control circuit 522 and/or other circuits (not shown) of HDTV 520 may process data, perform coding and/or encryption, perform calculations, format data and/or perform any other type of HDTV processing that may be required.

HDTV 520 may communicate with mass data storage 527 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". HDTV 520 may be connected to memory 528 such as RAM, ROM, low latency nonvolatile memory such as flash memory and/or other suitable electronic data storage. HDTV 520 also may support connections with a WLAN via a WLAN network interface 529.

Figure 6D:
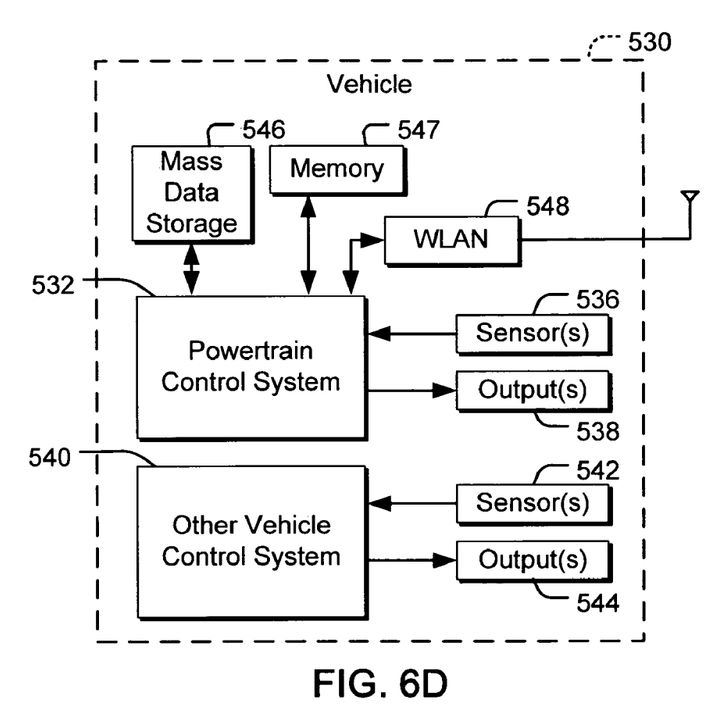
FIG. 6D is a block diagram of the invention in a vehicle control system.

Referring now to FIG. 6D, the present invention may be embodied as a voltage reference in a control system of a vehicle 530, a WLAN interface and/or mass data storage of the vehicle control system. In some implementations, the present invention implements a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 540 of vehicle 530. Control system 540 may likewise receive signals from input sensors 542 and/or output control signals to one or more output devices 544. In some implementations, control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 532 may communicate with mass data storage 546 that stores data in a nonvolatile manner. Mass data storage 546 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Powertrain control system 532 may be connected to memory 547 such as RAM, ROM, low latency nonvolatile memory such as flash memory and/or other suitable electronic data storage. Powertrain control system 532 also may support connections with a WLAN via a WLAN network interface 548. The control system 540 may also include mass data storage, memory and/or a WLAN interface (all not shown).

Figure 6E:
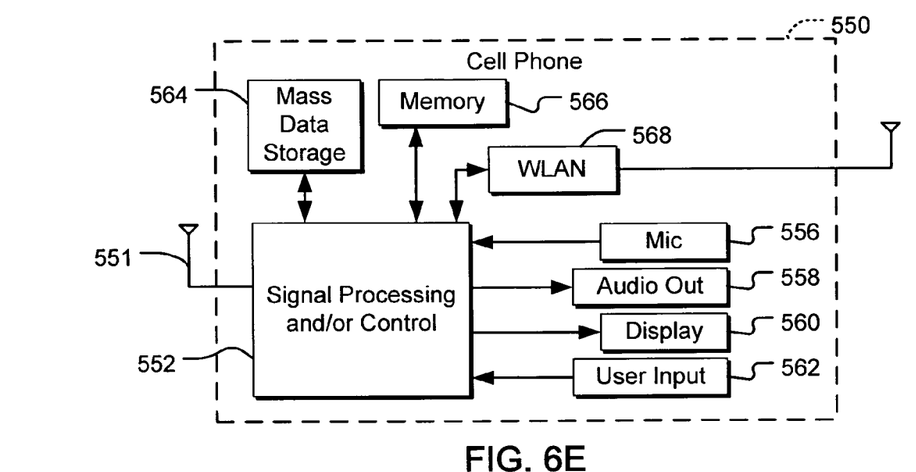
FIG. 6E is a block diagram of the invention in a cellular or mobile phone.

Referring now to FIG. 6E, the present invention may be embodied as a voltage reference in a cellular phone 550 that may include a cellular antenna 551. The present invention may implement either or both signal processing and/or control circuits, which are generally identified in FIG. 6E at 552, a WLAN interface and/or mass data storage of the cellular phone 550. In some implementations, cellular phone 550 includes a microphone 556, an audio output 558 such as a speaker and/or audio output jack, a display 560 and/or an input device 562 such as a keypad, pointing device, voice actuation and/or other input device. Signal processing and/or control circuits 552 and/or other circuits (not shown) in cellular phone 550 may process data, perform coding and/or encryption, perform calculations, format data and/or perform other cellular phone functions.

Cellular phone 550 may communicate with mass data storage 564 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Cellular phone 550 may be connected to memory 566 such as RAM, ROM, low latency nonvolatile memory such as flash memory and/or other suitable electronic data storage. Cellular phone 550 also may support connections with a WLAN via a WLAN network interface 568.

Figure 6F:
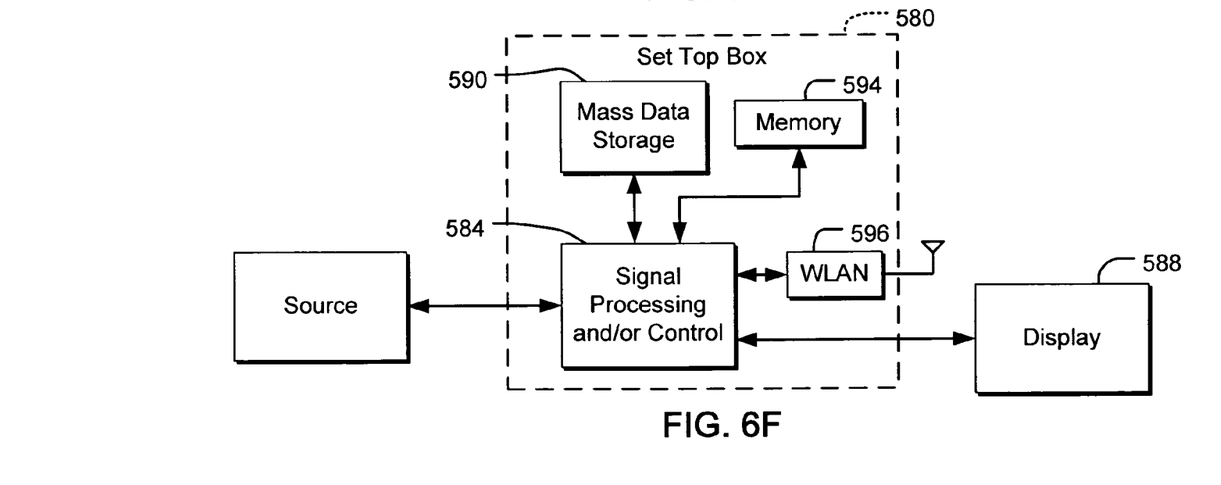
FIG. 6F is a block diagram of the invention in a set-top box (STB).

Referring now to FIG. 6F, the present invention may be embodied as a voltage reference in a set top box 580. The present invention may implement either or both signal processing and/or control circuits, which are generally identified in FIG. 6F at 584, a WLAN interface and/or mass data storage of the set top box 580. Set top box 580 receives signals from a source such as a broadband source and outputs standard and/or high definition audio/video signals suitable for a display 588 such as a television and/or monitor and/or other video and/or audio output devices. Signal processing and/or control circuits 584 and/or other circuits (not shown) of the set top box 580 may process data, perform coding and/or encryption, perform calculations, format data and/or perform any other set top box function.

Set top box 580 may communicate with mass data storage 590 that stores data in a nonvolatile manner. Mass data storage 590 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Set top box 580 may be connected to memory 594 such as RAM, ROM, low latency nonvolatile memory such as flash memory and/or other suitable electronic data storage. Set top box 580 also may support connections with a WLAN via a WLAN network interface 596.

Figure 6G:
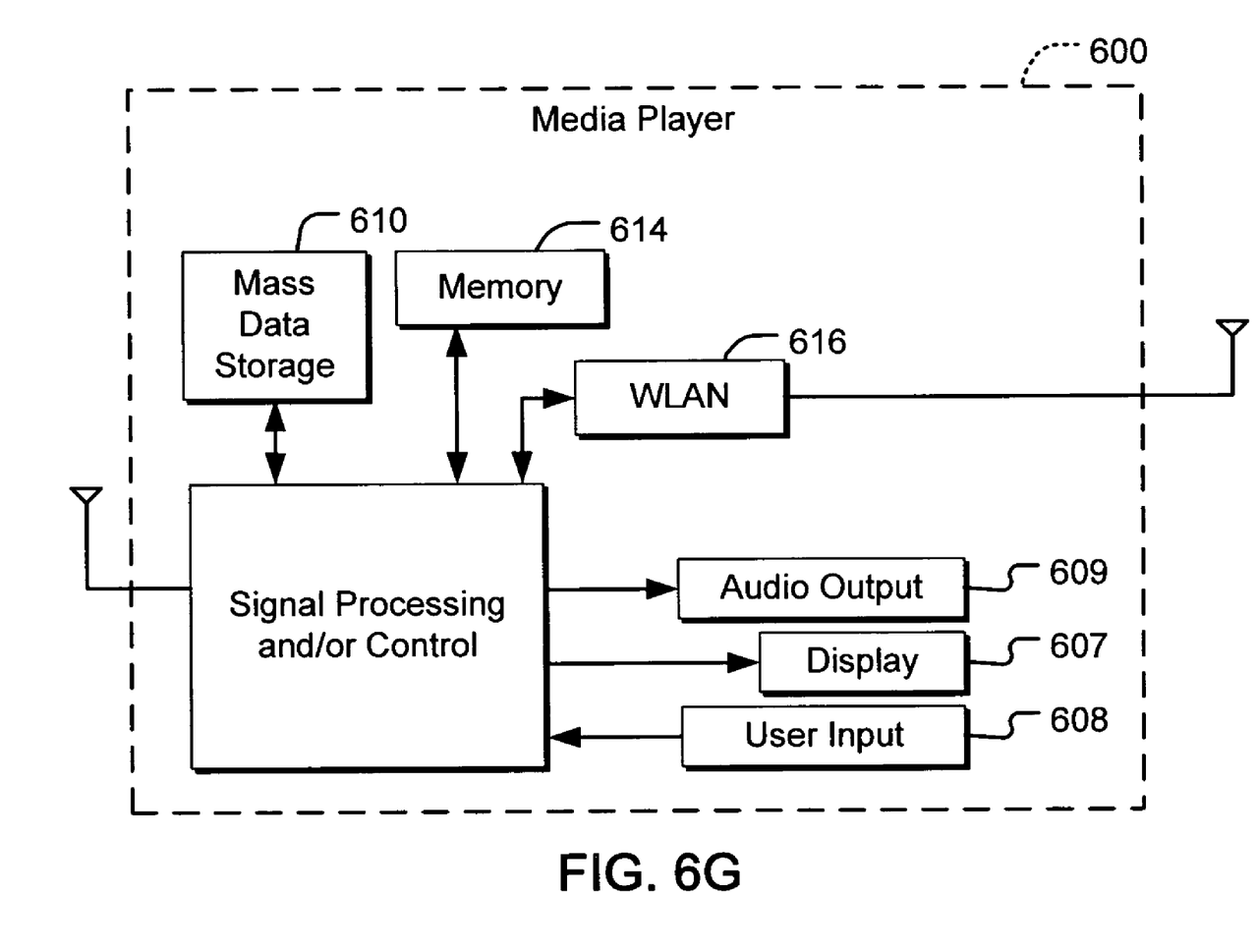
FIG. 6G is a block diagram of the invention in a media player.

Referring now to FIG. 6G, the present invention may be embodied as a reference voltage in a media player 600. The present invention may implement either or both signal processing and/or control circuits, which are generally identified in FIG. 6G at 604, a WLAN interface and/or mass data storage of the media player 600. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Media player 600 may be connected to memory 614 such as RAM, ROM, low latency nonvolatile memory such as flash memory and/or other suitable electronic data storage. Media player 600 also may support connections with a WLAN via a WLAN network interface 616. Still other implementations in addition to those described above are contemplated.

The invention has been described above with respect to particular illustrative embodiments. It is understood that the invention is not limited to the above-described embodiments and that various changes and modifications may be made by those skilled in the relevant art without departing from the spirit and scope of the invention.

What is claimed is:

1. A buffer for an input to an A/D converter which includes a sampling capacitor, comprising:
    a first circuit path which connects the input to the A/D converter through a first switch;
    a second circuit path which includes a buffer that provides a buffered output corresponding to the input, wherein said second circuit path further includes a second switch which connects said buffered output to the A/D converter; and
    a switch controller for providing switch control of said first and second switches, wherein during a sampling operation of the sampling capacitor, said switch controller operates in a first stage where said first switch is open and said second switch is closed, followed by a second stage where said first switch is closed;
    wherein in said first stage, said buffered output from said second circuit path pre-charges the sampling capacitor to a value substantially close to the input.

2. A buffer according to claim 1, wherein in said second stage, said second switch is open.

3. A buffer according to claim 1, further comprising a third switch which discharges the sampling capacitor, wherein during the sampling operation, said first and second stages are preceded by a stage in which said switch controller closes said third switch so as to discharge the sampling capacitor, and thereafter opens said third switch.

4. A buffer according to claim 1, further comprising a low pass filter whose input is a sampled signal, and which generates the input based on the sampled signal.

5. A buffer for an input to an A/D converter which includes a sampling capacitor, comprising:
    first circuit path means which connects the input to the A/D converter through first switch means;

second circuit path means which includes buffer means that provides a buffered output corresponding to the input, wherein said second circuit path means further includes second switch means which connects said buffered output to the A/D converter; and switch control means for providing switching control of said first and second switch means, wherein during a sampling operation of the sampling capacitor, said switch control means operates in a first stage where said first switch means is open and said second switch means is closed, followed by a second stage where said first switch means is closed;

wherein in said first stage, said buffered output from said second circuit path means pre-charges the sampling capacitor to a value substantially close to the input.

6. A buffer according to claim 5, wherein in said second stage, said second switch means is open.

7. A buffer according to claim 5, further comprising third switch means which discharges the sampling capacitor, wherein during the sampling operation, said first and second stages are preceded by a stage in which said switch control means closes said third switch means so as to discharge the sampling capacitor, and thereafter opens said third switch means.

8. A buffer according to claim 5, further comprising low pass filter means whose input is a sampled signal, and which generates the input based on the sampled signal.

9. A method for buffering an input to an A/D converter which includes a sampling capacitor during a sampling operation of the sampling capacitor, said method comprising:

a first stage of generating a buffered output corresponding to the input and providing the buffered output to the A/D converter;

a second stage, following said first stage, of connecting the input to the A/D converter;

providing a third switch which discharges the sampling capacitor; and providing a third stage preceding said first and second stages in which said third switch is controlled to discharge the sampling capacitor and thereafter to open.

10. A method according to claim 9, wherein in said first stage, the buffered output pre-charges the sampling capacitor to a value substantially close to the input.

11. A method according to claim 9, further comprising providing a low pass filter whose input is a sampled signal, and which generates the input based on the sampled signal.

12. A method according to claim 9, further comprising providing a first circuit path which connects the input to the A/D converter through a first switch, and providing a second circuit path which includes a buffer for providing the buffered output and which includes a second switch which connects the buffered output to the A/D converter.

13. A method according to claim 12, wherein in said first stage the first switch is controlled to be open and said second switch is controlled to be closed, and in said second stage said first switch is controlled to be closed.

14. A method according to claim 13, wherein in said second stage, said second switch is controlled to be open.

\* \* \* \* \*